US009060444B2

(12) United States Patent
Deng

(10) Patent No.: US 9,060,444 B2
(45) Date of Patent: Jun. 16, 2015

(54) SERVER AND FIXING ASSEMBLY THEREOF

(71) Applicants: Inventec (Pudong) Technology Corporation, Shanghai (CN); INVENTEC CORPORATION, Taipei (TW)

(72) Inventor: Jian-Jun Deng, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 115 days.

(21) Appl. No.: 14/071,425

(22) Filed: Nov. 4, 2013

(65) Prior Publication Data

US 2014/0340838 A1 Nov. 20, 2014

(30) Foreign Application Priority Data

May 20, 2013 (CN) .......................... 2013 1 0187587

(51) Int. Cl.
*H05K 5/00* (2006.01)
*H05K 7/00* (2006.01)
*G06F 1/16* (2006.01)
*H05K 7/14* (2006.01)
*H05K 5/02* (2006.01)

(52) U.S. Cl.
CPC ............ *H05K 7/1489* (2013.01); *H05K 5/0021* (2013.01); *H05K 5/0204* (2013.01); *G06F 1/1656* (2013.01); *G06F 1/1658* (2013.01); *H05K 5/0217* (2013.01); *H05K 7/1487* (2013.01)

(58) Field of Classification Search
CPC ... G06F 1/1656; G06F 1/1658; H05K 5/0021; H05K 5/0204; H05K 5/0217
USPC ............. 361/679.02, 679.37, 679.38, 679.39, 361/724, 725, 726, 727; 312/223.1, 223.2, 312/223.3
See application file for complete search history.

(56) References Cited

U.S. PATENT DOCUMENTS

| 6,560,114 | B2* | 5/2003 | Berry et al. .................... 361/727 |
| 6,944,702 | B1* | 9/2005 | Chilton et al. ................ 710/301 |
| 7,167,359 | B2* | 1/2007 | Wendel et al. ........... 361/679.36 |
| 7,319,586 | B2* | 1/2008 | Hall et al. ................ 361/679.33 |
| 7,394,660 | B2* | 7/2008 | Hidaka ......................... 361/727 |
| 7,876,556 | B2* | 1/2011 | Katakura et al. ......... 361/679.33 |
| 8,369,087 | B2* | 2/2013 | Wu et al. .................. 361/679.58 |
| 8,452,148 | B2* | 5/2013 | Cooke et al. .................. 385/135 |
| 8,737,078 | B2* | 5/2014 | Zhang et al. .................. 361/726 |
| 8,811,020 | B2* | 8/2014 | Song et al. .................... 361/724 |
| 8,941,997 | B2* | 1/2015 | Zhang et al. .................. 361/726 |
| 8,995,136 | B2* | 3/2015 | Kostecka et al. ............. 361/727 |
| 2006/0039108 | A1* | 2/2006 | Chikusa et al. ............... 361/695 |
| 2006/0262657 | A1* | 11/2006 | Sueyoshi ......................... 369/1 |
| 2007/0025076 | A1* | 2/2007 | Matsushima et al. ......... 361/687 |
| 2010/0310225 | A1* | 12/2010 | Anderson et al. ............. 385/135 |
| 2011/0267794 | A1* | 11/2011 | Anderson et al. ............. 361/810 |

* cited by examiner

*Primary Examiner* — Anthony Haughton
(74) *Attorney, Agent, or Firm* — Morris Manning & Martin LLP; Tim Tingkang Xia, Esq.

(57) ABSTRACT

A server includes a storage module, a processing module, a motherboard and a fixing assembly. The fixing assembly includes a carrier, a stopper, a tray, a first locking part and a second locking part. The stopper is securely located on the carrier. The storage module is securely located on the tray. A bottom wall of the tray has a fixing hole. The stopper engages with the tray through the fixing hole to make the tray securely attached to the carrier when the tray is located at the second position. The stopper is removed from the tray when the tray is located at the first position. The tray moves between the first position and the second position when the first locking part is located at the first state. The first locking part cooperates with the second locking part to lock the tray at the second position.

15 Claims, 8 Drawing Sheets

SERVER AND FIXING ASSEMBLY THEREOF

CROSS-REFERENCE TO RELATED APPLICATIONS

This non-provisional application claims priority under 35 U.S.C. §119(a) on Patent Application No(s). 201310187587.7 filed in China on May 20, 2013, the entire contents of which are hereby incorporated by reference.

TECHNICAL FIELD

The disclosure relates to a server and a fixing assembly thereof, more particularly to a server having a fixing assembly.

BACKGROUND

The server generally comprises a housing, a motherboard, multiple storage devices and processing units. The multiple storage devices are essential for the server. For example, the internet service providers allow their clients to save large quantities of data in the storage devices inside the server so as to maintain clients' business information and operation. Thus, the servers' performance is directly related to the storage capacity of the storage devices. For this reason, the manufacturer in the industry is eager to increase the number of the storage devices inside the server. During assembly, the storage devices are locked on the housing by screws and are arranged side by side for accommodating more storage devices in limited space inside the server.

However, locking the storage devices into the servers by the screws is time-consuming and cost-inefficient. For example, the internet service providers need to spend more efforts locking or disassembling the storage devices by using the screws one by one, therefore, it is inefficient that the users spend extra costs on locking or removing the storage devices on the housing.

SUMMARY

An embodiment of the disclosure provides a server and a fixing assembly thereof comprising a storage module, a processing module, a motherboard and a fixing assembly. The storage module is used for storing data. The processing module is electrically connected with the storage module and the processing module is located on the motherboard. The fixing assembly comprises a carrier, a stopper, a tray, a first locking part and a second locking part. The stopper is securely located on the carrier. The tray has a bottom wall. The storage module is located on the bottom wall and is securely fixed to the tray. The tray has a first position and a second position relative to the carrier. The bottom wall has a fixing hole and the stopper passes through the fixing hole. The tray is located at the second position when the stopper engages with the tray through the fixing hole to make the tray securely attached to the carrier. The tray is located at the first position when the stopper releases from engaging with the tray, allowing the tray to be removed from the carrier. A first locking part has a first state and a second state and is securely located on the tray. The tray is able to move between the first position and the second position when the first locking part is located at the first state, such that the stopper is able to switch between engaging with the tray and releasing from engaging with the tray. A second locking part is securely located on the carrier. The first locking part cooperates with the second locking part to lock the tray at the second position when the tray is located at the second position and the first locking part is located at the second state.

BRIEF DESCRIPTION OF THE DRAWING

The disclosure will become more fully understood from the detailed description given herein below and the drawing are for illustration only, and thus does not limit the present disclosure, wherein.

DETAILED DESCRIPTION

Figure 1:
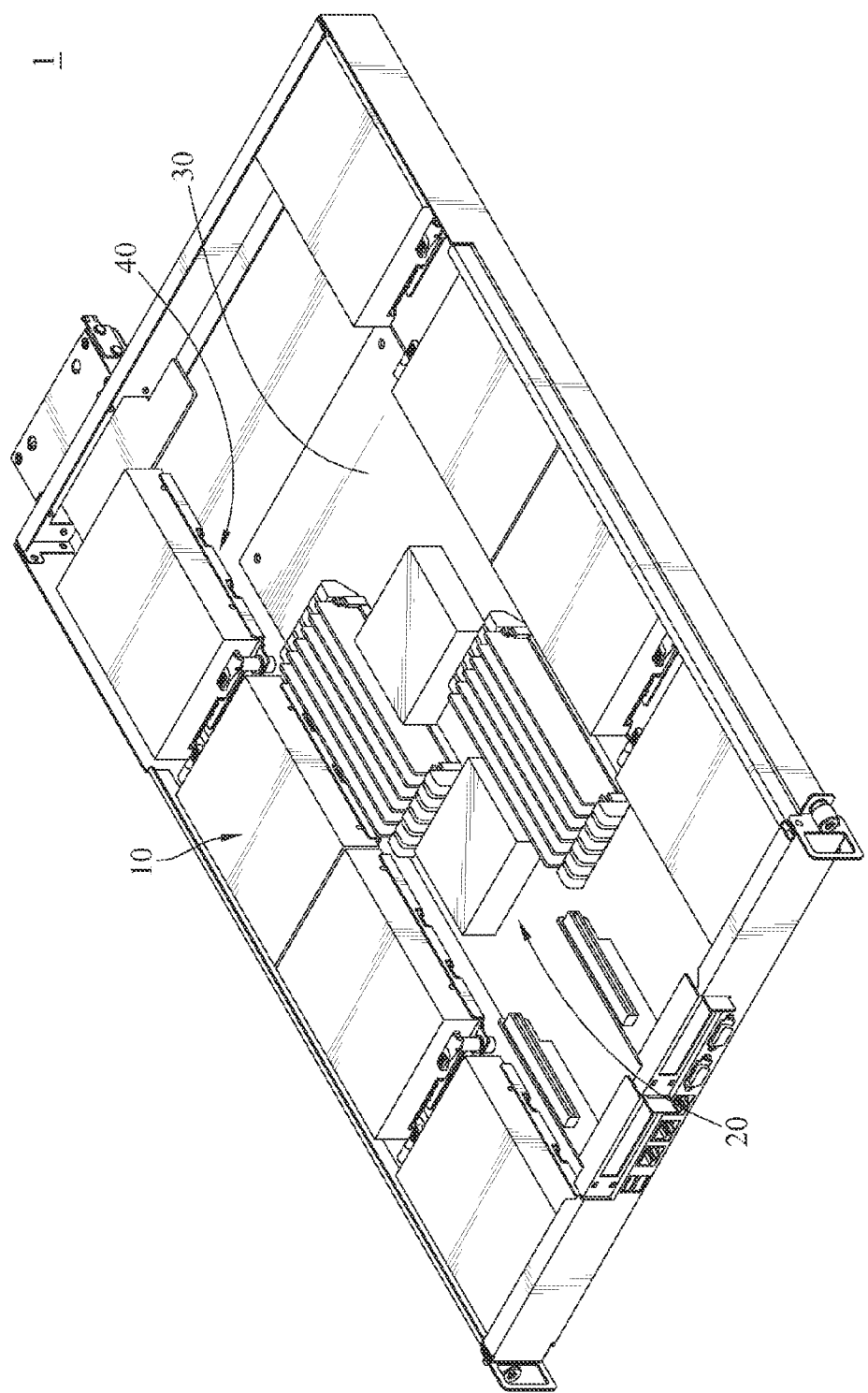
FIG. 1 is a perspective view of a server according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to the FIG. 1, which is a perspective view of a server according to an embodiment of the disclosure. The server 1 of the disclosure comprises a storage module 10, a processing module 20, a motherboard 30 and a fixing assembly 40. For example, the storage module 10 is a HDD (hard disk drive) and the processing module 20 is a CPU (central process unit). The storage module 10 is used to store data. The processing module 20 is electrically connected with the storage module 10 for accessing the data stored in the storage module 10. The processing module 20 is located on the motherboard 30. The storage module 10 is located in the server 1 by the fixing assembly 40.

Figure 2:
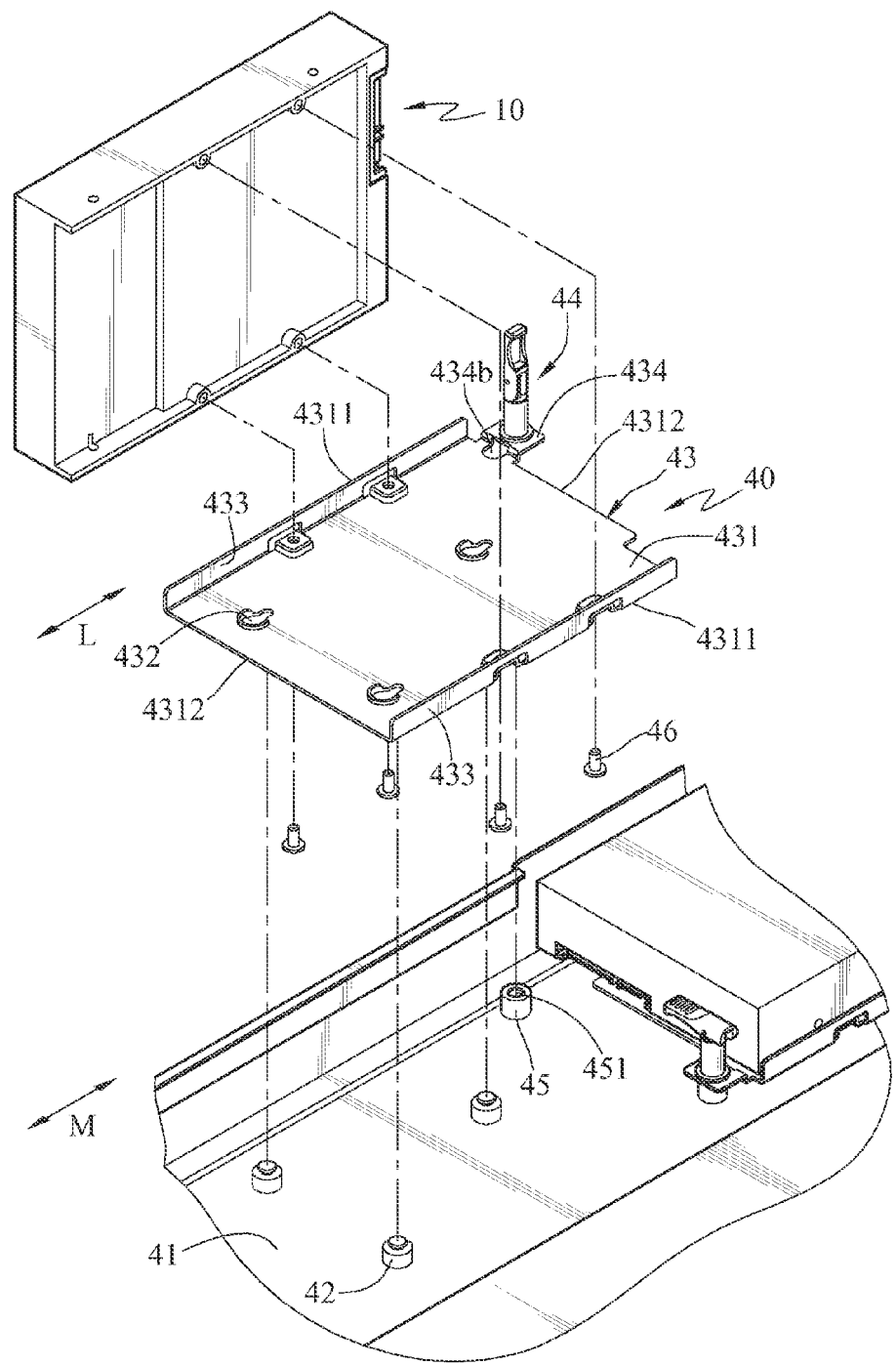
FIG. 2 is an exploded view of a fixing assembly described in FIG. 1.

Please refer to the FIG. 2, which is an exploded view of a fixing assembly described in FIG. 1. The fixing assembly 40 comprises a carrier 41, a plurality of stoppers 42, a tray 43, a first locking part 44, a second locking part 45 and a plurality of fasteners 46.

In this embodiment of the disclosure, the carrier 41 may be a part of a housing of the server 1, but the disclosure is not limited thereto. For example, the carrier 41 may be a bearing plate inside the housing of the server, rather than a part of the housing. The motherboard 30 is located on the carrier 41 and the stopper 42 is securely located on the carrier 41. For example, the stopper 42 is riveted to the carrier 41. The tray 43 includes a bottom wall 431, two side walls 433 and a cantilever arm 434. The two side walls 433 extend from the bottom wall 431 and are connected with two opposite sides of the bottom wall 431. The cantilever arm 434 extends from another side of the bottom wall 431 which is different from the two opposite sides of the bottom wall 431. The storage module 10 is located on the bottom wall 431 and is located between the two side walls, and the storage module 10 is securely fixed to the tray 43. The bottom wall 431 has a fixing hole 432 and the stopper 42 passes through the fixing hole 432. The first locking part 44 is securely located on the tray 43. In this embodiment of the disclosure, the first locking part 44 is securely located on the cantilever arm 434 and the second locking part 45 is securely located on the carrier 41. For example, the first locking part 44 is riveted to the tray 43 and the second locking part 45 is riveted to the carrier 41.

The fixing hole 432 has a long-axis direction L. The bottom wall 431 is a rectangle with two long sides 4311 and two short sides 4312. The long-axis direction L is parallel to the two long sides 4311 of the bottom wall 431. Measured along the long-axis direction L, the size of the fixing hole 432 is longest than that measured along any other direction parallel to the bottom wall 431. The fixing hole 432 is a keyhole or gourd shape hole. The fixing hole 432 includes a first portion 4321 and a second portion 4322 which is opposite to the first portion 4321. The connection line which connects the first portion 4321 and the second portion 4322 is substantially parallel to the long-axis direction L. The width W1 of the first portion 4321 is wider than the width W2 of the second portion 4322. The stopper 42 includes a head part 421 and a neck part 422. The width W3 of the head part 421 is narrower than the width W1 of the first portion 4321 of the fixing hole 432, and is wider than the width W2 of the second portion 4322. The width W4 of the neck part 422 is narrower than the width W2 of the second portion 4322 of the fixing hole 432.

The tray 43 further comprises two side walls 433 which are connected with two opposite sides of the bottom wall 431. The storage module 10 is located between the two side walls 433. The storage module 10 is detachably locked on the bottom wall 431 by the plurality of fasteners 46.

The tray 43 has a first position and a second position relative to the carrier 41. The tray 43 moves between the first position and the second position along a moving direction M, and the long-axis direction L is parallel to the moving direction M. The first locking part 44 has a first state and a second state. The tray 43 is able to move between the first position and the second position when the first locking part 44 is located at the first state, such that the stopper 42 is able to switch between engaging with the tray 43 and releasing from engaging with the tray 43. The first locking part 44 cooperates with the second locking part 45 to lock the tray 43 at the second position when the tray 43 is located at the second position and the first locking part 42 is located at the second state.

Figure 3A:
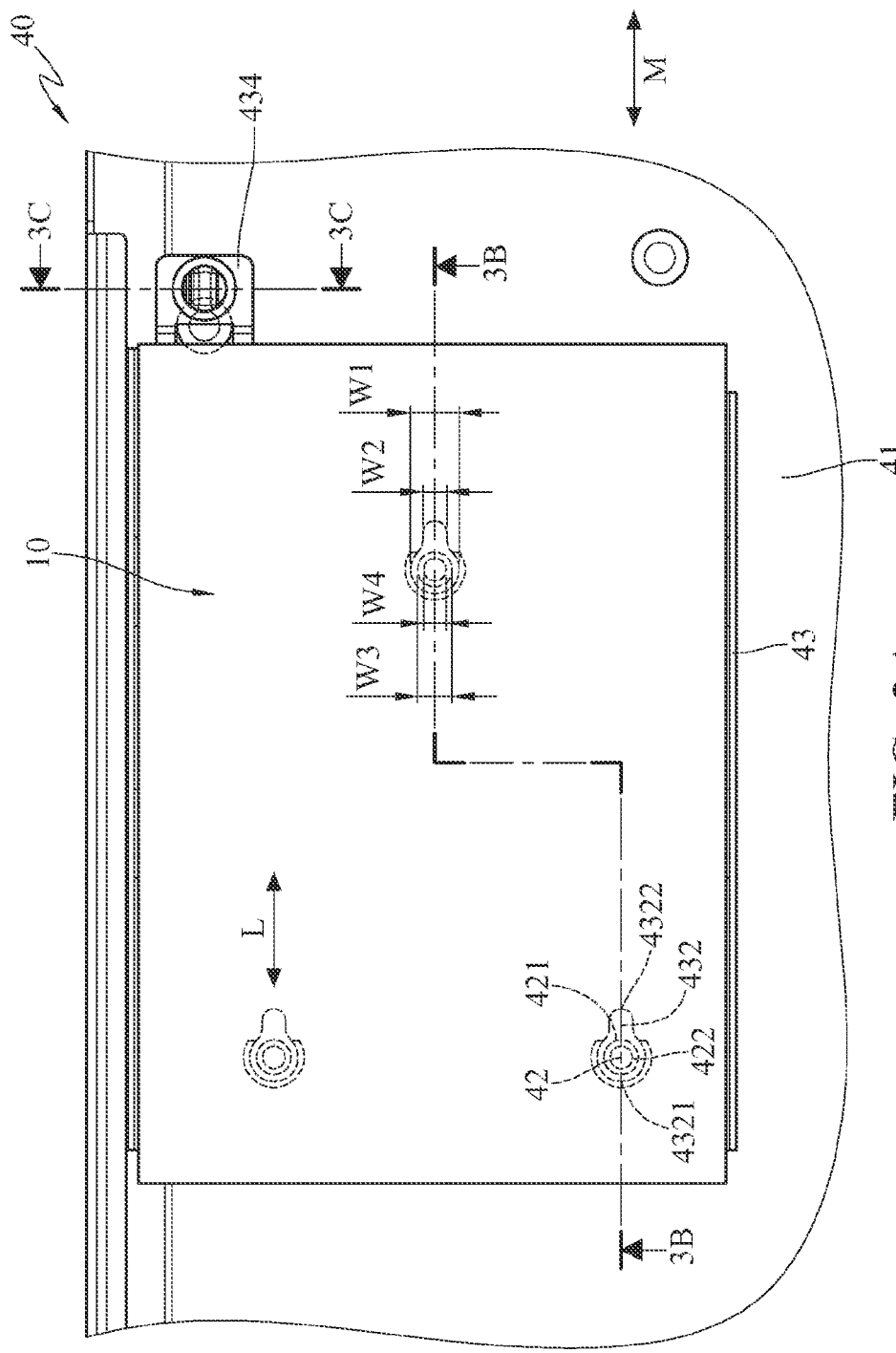
FIG. 3A is a top view of the tray located at the first position and the first locking part located at the first state described in FIG. 2.
Figure 3B:
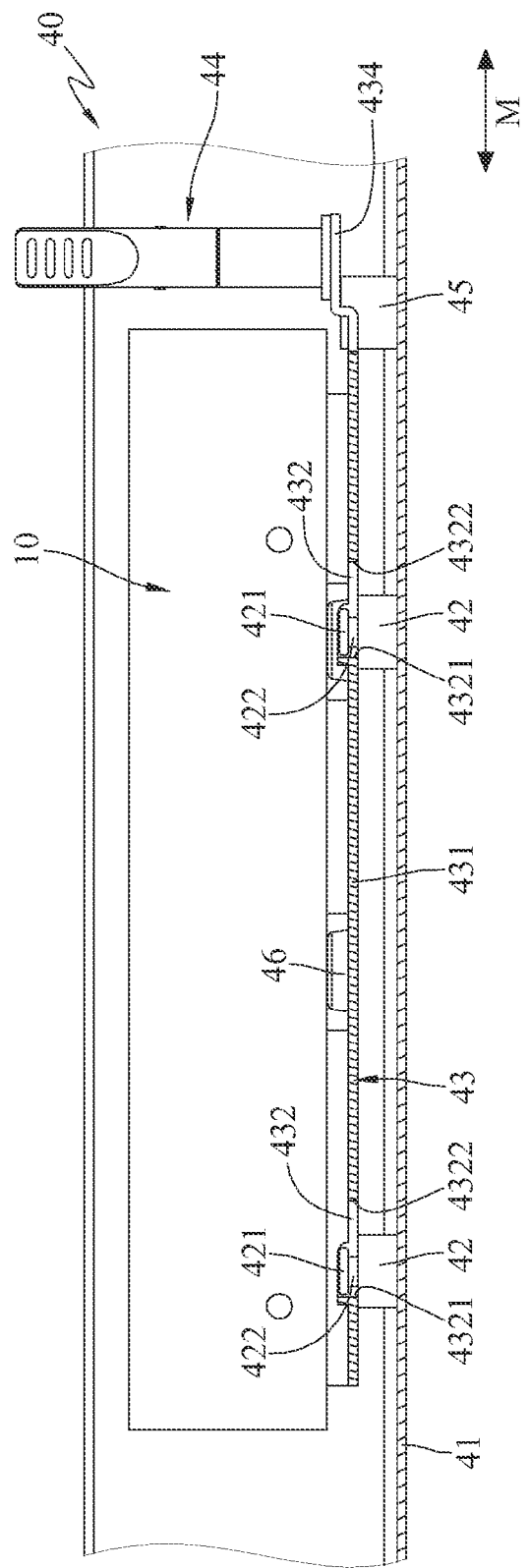
FIG. 3B and FIG. 3C are side views described in FIG. 3A.
Figure 3C:
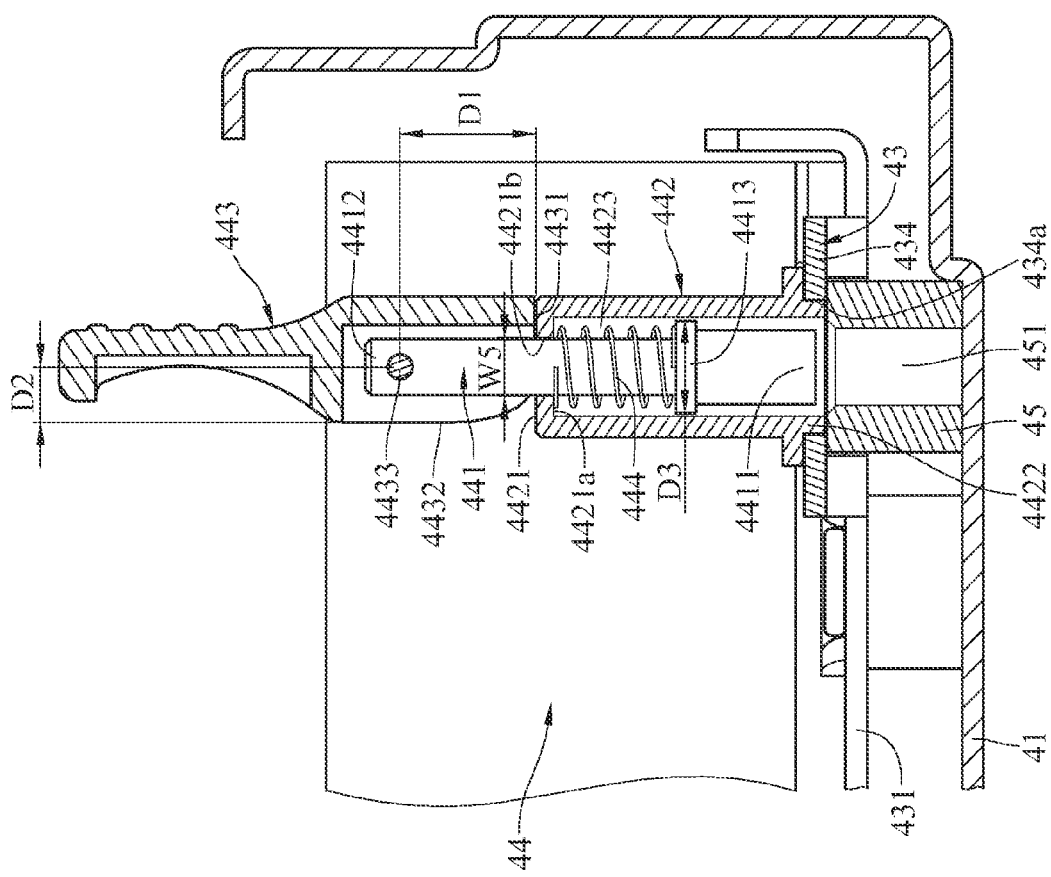

Please refer to the FIG. 3A, FIG. 3B and FIG. 3C. FIG. 3A is a top view when the tray located at the first position and the first locking part located at the first state described in FIG. 2. FIG. 3B and FIG. 3C are side views described in FIG. 3A. The second locking part 45 has an opening 451. The first locking part 44 comprises a latch rod 441, a base 442, a shift lever 443 and an elastic member 444. In this embodiment of the disclosure, the base 442 is riveted to the tray 43 and the elastic member 444 is a spring. The base 442 is located on the tray 43 and has a top end 4421, a bottom end 4422 which is opposite to the top end 4421 and an accommodation space 4423 which is formed between the top end 4421 and the bottom end 4422. The shift lever 443 is located on the top end 4421 and has a first abutment surface 4431, a second abutment surface 4432 and a horizontal axis 4433 which is perpendicular to the latch rod 441. The horizontal axis 4433 is parallel to the first abutment surface 4431 and the second abutment surface 4432, and the vertical distance D1 between the horizontal axis 4433 and the first abutment surface 4431 is larger than the vertical distance D2 between the horizontal axis 4433 and the second abutment surface 4432.

The latch rod 441 is partially and movably located inside the accommodation space 4423. The latch rod 441 includes a first end 4411, a second end 4412 and a protruding portion 4413. The second end 4412 of the latch rod 441 which is opposite to the first end 4411 is located outside the accommodation space 4423 and the horizontal axis 4433 passes through the second end 4412 of the latch rod 441. The latch rod 441 is pivotally connected with the shift lever 443 through the horizontal axis 4433. The protruding portion 4413 is a circular flange. The protruding portion 4413 is located between the first end 4411 and the second end 4412 of the latch rod 441 and is located inside the accommodation space 4423. The protruding portion 4413 protrudes along a radial direction of the latch rod 441. The top end 4421 of the base 442 comprises a top wall 4421a which has a perforation 4421b. The perforation 4421b of the top wall 4421a is a circular hole. The diameter D3 of the perforation 4421b is narrower than the width W5 of the protruding portion 4413, and the diameter of the elastic member 444 is wider than the diameter D3 of the perforation 4421b but is narrower than width W5 of the protruding portion 4413. The second end 4412 passes through the perforation 4421b of the top wall 4421a.

The elastic member 444 sleeves the latch rod 441. The elastic member 444 is located inside the accommodation space 4423 and is pressed between the top wall 4421a and the protruding portion 4413 of the latch rod 441.

The base 442 and the second locking part 45 are cylindrical shape and are both perpendicular to the bottom wall 431. The cantilever arm 434 has a through opening 434a and an avoiding opening 434b. The bottom end 4422 of the base 442 is securely located on the cantilever arm 434. The bottom end 4422 of the base 442 is at least partially accommodated in the through opening 434a and is riveted to the cantilever arm 434. The avoiding opening 434b provides space for partly receiving the second locking part 45. The avoiding opening 434b is between the bottom wall 431 and the through opening 434a. When the tray 43 locates at the first position, the second locking part 45 is partly received in the avoiding opening 434b and the through opening 434a and the second locking part 45 are misaligned with each other. When the tray 43 locates at the second position, the through opening 434a and the second locking part 45 are aligned with each other.

When the storage module 10 is mounted by the users, the storage module 10 is fastened to the tray 46 by the plurality of fasteners 46, and the storage module 10 is connected with the processing module 20 described in the FIG. 1 by cable (not shown). Next, the first portion 4321 of the fixing hole 432 on the tray 43 aligns with the stopper 42, such that the stopper 42 passes through the first portion 4321 of the fixing hole 432 and the tray is located at the first position when the stopper 42 locates in the first portion 4321. At this moment, the base 422 and the second locking part 45 are misaligned with each other. The stopper 42 and the tray 43 are at released state, such that the stopper 42 may be removed from the fixing hole 432, which makes the tray 43 located on or removed from the carrier 41. The first abutment surface 4431 of the shift lever 443 is contacted with the top end 4421 of the base 442 and the first end 4411 of the latch rod 441 is located inside the accommodation space 4423 and does not protrude into the second locking part 45, when the first locking part 44 is located at the first state. Because the first end 4411 of the latch rod 441 does not protrude into the second locking part 45, allowing the tray 43 moves to the second position from the first position, and moves to the first position from the second position as well.

Figure 4A:
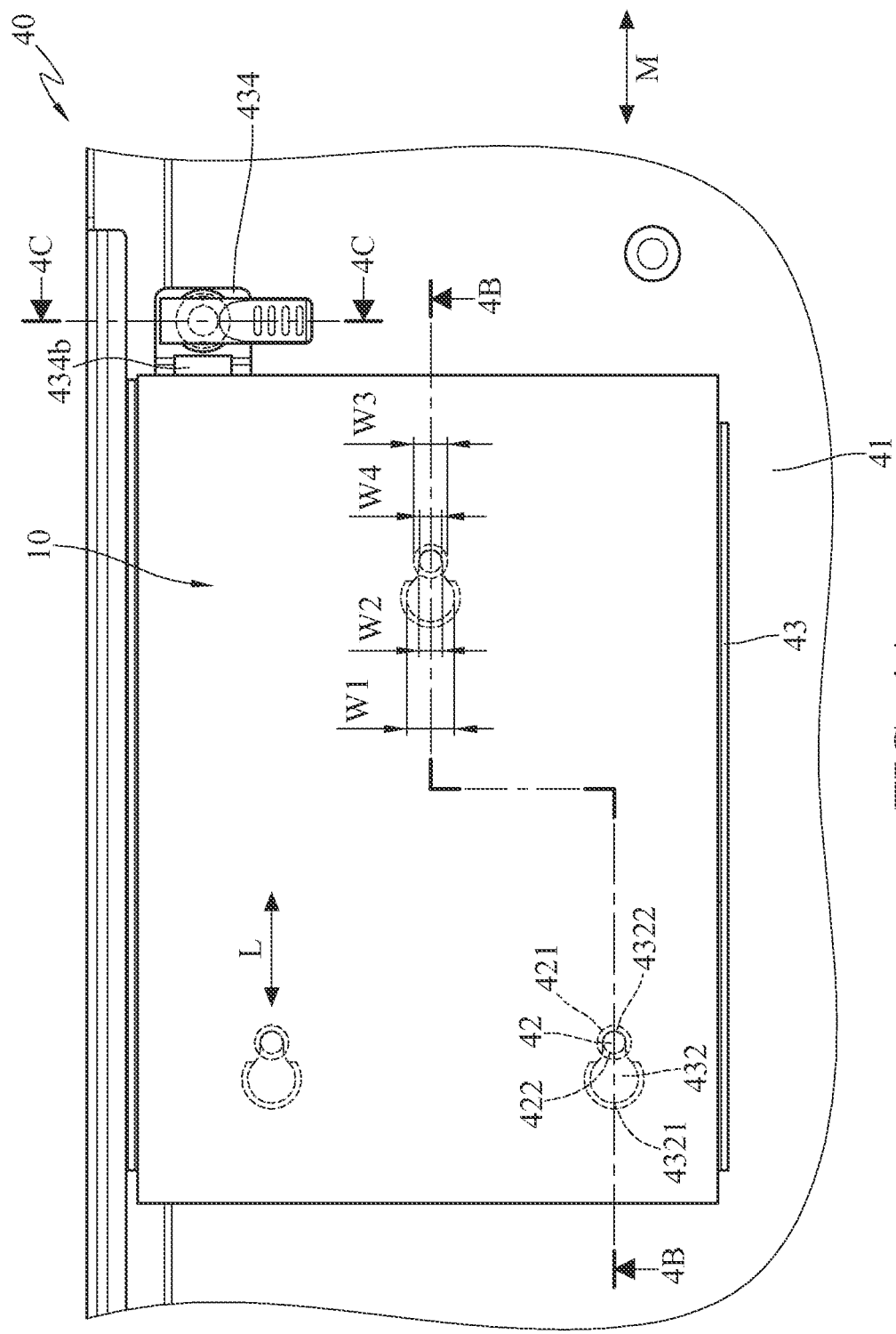
FIG. 4A is a top view of the tray located at the second position and the first locking part located at the second state described in FIG. 2.
Figure 4B:
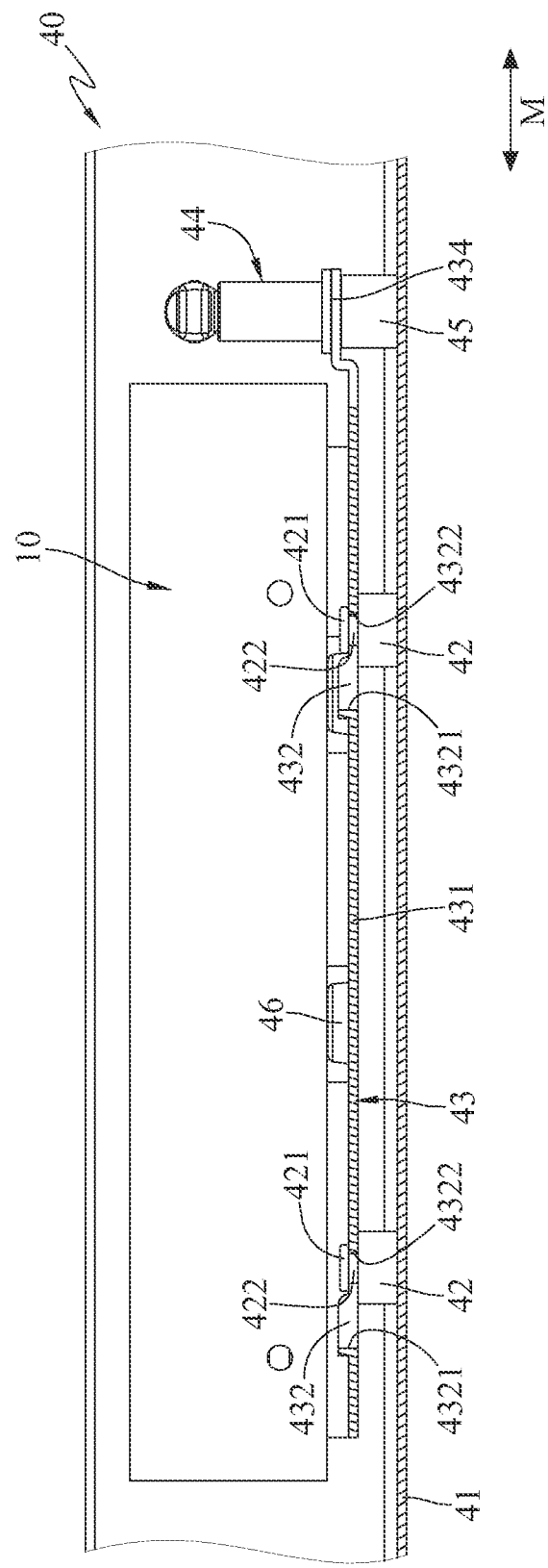
FIG. 4B and FIG. 4C are side views described in FIG. 4A.
Figure 4C:
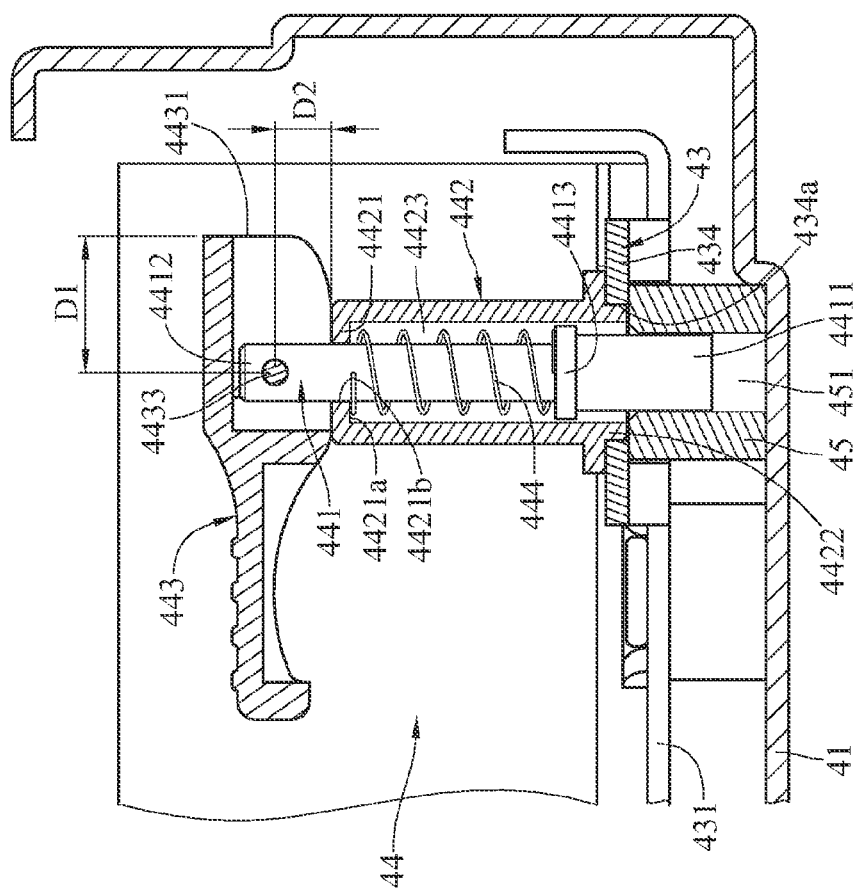

Please refer to the FIG. 4A, FIG. 4B and FIG. 4C. FIG. 4A is a top view when the tray located at the second position and the first locking part located at the second state described in FIG. 2. FIG. 4B and FIG. 4C are side views described in FIG. 4A. The stopper 42 moves to the second portion 4322 of the fixing hole 432 when the tray 43 is located at the second position. Because the width W3 of the head part 421 of the stopper 42 is wider than the width W2 of the second portion 4322 of the fixing hole 432, such that the stopper 42 is engaged with the tray 43 via the fixing hole 432 and the tray 43 is securely located on the carrier 41. At this moment, the base 442 and the second locking part 45 are aligned with each other in a vertical direction perpendicular to the bottom wall 431.

When the shift lever 443 is rotated an angle relative to the horizontal axis 4433 by the users, the first locking part 44 at the first state can be converted into the second state. In this embodiment of the disclosure, the rotated angle is 90 degrees. The second abutment surface 4432 of the shift lever 443 is contacted with the top end 4421 of the base 442 and the first end 4411 of the latch rod 441 passes through the bottom end 4422 of the base 442 and protrudes into the second locking part 45 via the opening 451 of the second locking part 45, when the first locking part 42 is located at the second state, such that the tray 43 is locked at the second position. The cooperation of the first locking part 44 and the second locking part 45 limits the position of the tray 43 relative to the carrier 41 in a horizontal direction.

Compare the FIG. 3C with the FIG. 4C, the compression deformation of the elastic member 444 when the first locking part 44 is located at the first state is higher than that when the first locking part 44 is located at the second state. When the first locking part 44 is located at the second state and the tray 43 is located at the second position, the elastic member 444 presses the latch rod 441 to protrude into the second locking part 45, which forces the first locking part 44 to tightly cooperate with the second locking part 45 regardless of the external vibration.

According to the embodiment of the server, firstly the storage module is rapidly located inside the server. Then the tray is securely located on the carrier by the engagement between the stopper and the fixing hole. Next, the tray is locked at the position by the cooperation between the first locking part and the second locking part. When the storage module needs to be disassembled, the first locking part is switch from the second state to the first state, so as to be able to release from the second to not cooperate with the second locking part, and then the engagement between the stopper and the fixing hole is removed. In the wan above the tray may be removed from the carrier. Then the storage module and the tray may be picked to the outside of the server to remove the storage module from the tray.

What is claimed is:

1. A server, comprising:
   a storage module for storing data;
   a processing module electrically connected with the storage module;
   a motherboard where the processing module is located; and
   a fixing assembly, comprising:
      a carrier;
      a stopper securely located on the carrier;
      a tray having a bottom wall, wherein the storage module is located on the bottom wall and is securely fixed to the tray, wherein the tray has a first position and a second position relative to the carrier, wherein the bottom wall has a fixing hole and the stopper passes through the fixing hole, wherein when the tray is located at the second position, the stopper engages with the tray through the fixing hole to make the tray securely attached to the carrier, wherein when the tray is located at the first position, the stopper releases from engaging with the tray, allowing the tray to be removed from the carrier;
      a first locking part having a first state and a second state and securely located on the tray, wherein the tray is able to move between the first position and the second position when the first locking part is located at the first state, such that the stopper is able to switch between engaging with the tray and releasing from engaging with the tray; and
      a second locking part securely located on the carrier, wherein the first locking part cooperates with the second locking part to lock the tray at the second position when the tray is located at the second position and the first locking part is located at the second state.

2. The server according to claim 1, wherein the fixing hole has a long-axis direction, the tray moves between the first position and the second position along a moving direction, and the long-axis direction is parallel to the moving direction and the bottom wall.

3. The server according to claim 1, wherein the tray further comprises two side walls connected with two opposite sides of the bottom wall, respectively, wherein the storage module is located between the two side walls, and the fixing assembly further comprises a plurality of fasteners and the storage module is detachably locked on the bottom wall by the plurality of fasteners.

4. The server according to claim 1, wherein the first locking part has a latch rod and the second locking part has an opening, wherein a first end of the latch rod protrudes into the second locking part via the opening to lock the tray at the second position when the tray is located at the second position and the first locking part is located at the second state, wherein the first end of the latch rod is located outside the second locking part to move the tray to the first position from the second position when the tray is located at the second position and the first locking part is located at the first state.

5. The server according to claim 1, wherein the first locking part further comprises:
   a base securely located on the tray and having a top end, a bottom end opposite to the top end and an accommodation space formed between the top end and the bottom end; and
   a shift lever located on the top end and having a horizontal axis perpendicular to the latch rod, a first abutment surface and a second abutment surface, wherein the horizontal axis is parallel to the first abutment surface and the second abutment surface, and the vertical distance between the horizontal axis and the first abutment surface is larger than that between the horizontal axis and the second abutment surface;
   wherein the latch rod is partially and movably located inside the accommodation space, a second end of the latch rod which is opposite to the first end is located outside the accommodation space, wherein the horizontal axis passes through the second end of the latch rod, and the latch rod pivotally connects with the shift lever through the horizontal axis, wherein the first abutment surface of the shift lever is contacted with the top end of the base and the first end of the latch rod is located inside the accommodation space when the first locking part is at the first state, wherein the second abutment surface of the shift lever is contacted with the top end of the base, and the first end of the latch rod passes through the bottom end of the base and protrudes into the second locking part when the tray is located at the second position and the first locking part is located at the second state.

6. The server according to claim 5, wherein the first locking part further comprises an elastic member sleeving the latch rod, the latch rod has a protruding portion located between the first end and the second end of the latch rod and located inside the accommodation space, wherein the protruding portion protrudes along a radial direction of the latch rod, wherein the top end of the base comprises a top wall having a perforation, the second end of the latch rod passes through the perforation, wherein the elastic member is pressed between the top wall and the protruding portion of the latch rod and is located inside the accommodation space, and the compression deformation of the elastic member when the first locking part is located at the first state is higher than that when the first locking part is located at the second state.

7. The server according to claim 6, wherein the base and the second locking part are cylindrical shape and are both perpendicular to the bottom wall, wherein the base and the second locking part are misaligned with each other when the tray is located on the first position, the base and the second locking part are aligned with each other in a vertical direction perpendicular to the bottom wall when the tray is located at the second position.

8. The server according to claim 5, wherein the tray further comprises two side walls connected with two opposite sides of the bottom wall, respectively, and a cantilever arm extending from another side of the bottom wall which is between the two opposite sides of the bottom wall, wherein the storage module is located between the two side walls, the cantilever arm has a through opening, the bottom end of the base is securely located on the cantilever arm and the bottom end of the base is at least partially accommodated in the through opening.

9. A fixing assembly used for storing a storage module, the fixing assembly comprising:
   a carrier;
   a stopper securely located on the carrier;
   a tray having a bottom wall, wherein the storage module is located on the bottom wall and is securely fixed to the tray, wherein the tray has a first position and a second position relative to the carrier, wherein the bottom wall has a fixing hole and the stopper passes through the fixing hole, wherein when the tray is located at the second position, the stopper engages with the tray through the fixing hole to make the tray securely fixed to the carrier, wherein when the tray is located at the first position, the stopper releases from engaging with the tray, allowing the tray to be removed from the carrier;
   a first locking part having a first state and a second state and securely located on the tray, wherein the tray is able to move between the first position and the second position when the first locking part is located at the first state, such that the stopper is able to switch between engaging with the tray and releasing from engaging with the tray; and
   a second locking part securely located on the carrier, wherein the first locking part cooperates with the second locking part to lock the tray at the second position when the tray is located at the second position and the first locking part is located at the second state.

10. The fixing assembly according to claim 9, wherein the fixing hole has a long-axis direction, the tray moves between the first position and the second position along a moving direction, and the long-axis direction is parallel to the moving direction and the bottom wall.

11. The fixing assembly according to claim 9, wherein the first locking part has a latch rod and the second locking part has an opening, wherein a first end of the latch rod protrudes into the second locking part via the opening to lock the tray at the second position when the tray is located at the second position and the first locking part is located at the second state, wherein the first end of the latch rod is located outside the second locking part to move the tray to the first position from the second position when the tray is located at the second position and the first locking part is located at the first state.

12. The fixing assembly according to claim 11, wherein the first locking part further comprises:
   a base securely located on the tray and having a top end, a bottom end opposite to the top end and an accommodation space formed between the top end and the bottom end; and
   a shift lever located on the top end and having a horizontal axis perpendicular to the latch rod, a first abutment surface and a second abutment surface, wherein the horizontal axis is parallel to the first abutment surface and the second abutment surface, and the vertical distance between the horizontal axis and the first abutment surface is larger than that between the horizontal axis and the second abutment surface;
   wherein the latch rod is partially and movably located inside the accommodation space, a second end of the latch rod which is opposite to the first end is located outside the accommodation space, wherein the horizontal axis passes through the second end of the latch rod, and the latch rod pivotally connects with the shift lever through the horizontal axis, wherein the first abutment surface of the shift lever is contacted with the top end of the base and the first end of the latch rod is located inside the accommodation space when the first locking part is at the first state, wherein the second abutment surface of the shift lever is contacted with the top end of the base, and the first end of the latch rod passes through the bottom end of the base and protrudes into the second locking part when the tray is located at the second position and the first locking part is located at the second state.

13. The fixing assembly according to claim 12, wherein the first locking part further comprises an elastic member sleeving the latch rod, the latch rod has a protruding portion located between the first end and the second end of the latch rod and located inside the accommodation space, wherein the protruding portion protrudes along a radial direction of the latch rod, wherein the top end of the base comprises a top wall having a perforation, the second end of the latch rod passes through the perforation, wherein the elastic member is pressed between the top wall and the protruding portion of the latch rod and is located inside the accommodation space, and the compression deformation of the elastic member when the first locking part is located at the first state is higher than that when the first locking part is located at the second state.

14. The fixing assembly according to claim 13, wherein the base and the second locking part are cylindrical shape and are both perpendicular to the bottom wall, wherein the base and the second locking part are misaligned with each other when the tray is located on the first position, the base and the second locking part are aligned with each other in a vertical direction perpendicular to the bottom wall when the tray is located at the second position.

15. The fixing assembly according to claim 12, wherein the tray further comprises two side walls connected with two opposite sides of the bottom wall, respectively, and a cantilever arm extending from another side of the bottom wall which is between the two opposite sides of the bottom wall, wherein the storage module is located between the two side walls, the cantilever arm has a through opening, the bottom end of the base is securely located on the cantilever arm and the bottom end of the base is at least partially accommodated in the through opening.

\* \* \* \* \*